US010008582B2

(12) United States Patent
Xie et al.

(10) Patent No.: US 10,008,582 B2
(45) Date of Patent: Jun. 26, 2018

(54) SPACERS FOR TIGHT GATE PITCHES IN FIELD EFFECT TRANSISTORS

(71) Applicant: GLOBALFOUNDRIES Inc., Grand Cayman (KY)

(72) Inventors: Ruilong Xie, Schenectady, NY (US); Chun-chen Yeh, Danbury, CT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/361,790

(22) Filed: Nov. 28, 2016

(65) Prior Publication Data

US 2018/0151689 A1      May 31, 2018

(51) Int. Cl.
*H01L 21/00* (2006.01)
*H01L 29/66* (2006.01)
*H01L 29/78* (2006.01)

(52) U.S. Cl.
CPC .... *H01L 29/6656* (2013.01); *H01L 29/66795* (2013.01); *H01L 29/7851* (2013.01)

(58) Field of Classification Search
CPC ..... H01L 21/823418; H01L 21/823814; H01L 29/41783; H01L 29/6656; H01L 29/66795; H01L 29/7851
See application file for complete search history.

(56) References Cited

U.S. PATENT DOCUMENTS

| 2007/0034906 A1* | 2/2007 | Wang | H01L 21/823807 257/224 |
| 2007/0057324 A1* | 3/2007 | Tews | H01L 29/6653 257/347 |
| 2007/0152271 A1* | 7/2007 | Dewey | H01L 21/28088 257/346 |
| 2008/0258233 A1* | 10/2008 | Hsiao | H01L 21/823807 257/382 |
| 2012/0286364 A1* | 11/2012 | Cheng | H01L 21/823418 257/369 |

* cited by examiner

*Primary Examiner* — Dale E Page
*Assistant Examiner* — Quovaunda V Jefferson
(74) *Attorney, Agent, or Firm* — Thompson Hine LLP; Yuanmin Cai

(57) ABSTRACT

Structures for spacers of a field-effect transistor and methods for forming such spacers. A mask layer has a feature separated from a vertical sidewall of a first gate structure by a space of predetermined width that exposes a top surface of a semiconductor body. A spacer is formed adjacent to the vertical sidewall of the first gate structure. The spacer has a first section in the space and a second section. The first section of the spacer is located vertically between the second section of the spacer and the top surface of the semiconductor body. The first section of the spacer extends through the space to the top surface of the semiconductor body, and the first section of the spacer fully fills the space.

20 Claims, 5 Drawing Sheets

SPACERS FOR TIGHT GATE PITCHES IN FIELD EFFECT TRANSISTORS

BACKGROUND

The present invention relates to semiconductor device fabrication and integrated circuits and, more specifically, to structures for spacers of a field-effect transistor and methods for forming spacers of a field-effect transistor.

Complementary-metal-oxide-semiconductor (CMOS) processes may be used to build a combination of p-channel and n-channel field-effect transistors (nFETs and pFETS) that are coupled to implement logic gates and other types of circuits, such as switches. Field-effect transistors generally include an active semiconductor region, a source, a drain, and a gate electrode. When a control voltage exceeding a threshold voltage is applied to the gate electrode, an inversion or depletion layer is formed in a channel defined in the active semiconductor region between the source and drain by the resultant electric field, and carrier flow occurs between the source and drain to produce a device output current.

The sidewalls of the gate electrode are clad with dielectric spacers to provide electrical isolation. The dielectric spacers may be formed by depositing a conformal layer of a dielectric material and directional dry etching. The dielectric spacers have a minimum thickness that is specified to provide adequate electrical isolation and that takes into account thickness reduction due to erosion as part of a replacement metal gate process. As the gate pitch shrinks with advancements in technology node, the spacing between adjacent gate electrodes for the formation of the dielectric spacers is narrowed. The narrowed spacing may lead to pinch-off when the conformal layer of dielectric material is deposited. Even in the absence of pinch-off, the narrowed spacing may lead to difficulties in filling the space between the spacer-clad gate electrodes with a material used in subsequent patterning of contact openings.

SUMMARY

In an embodiment of the invention, a method includes forming a mask layer having a feature separated from a vertical sidewall of a first gate structure by a space of predetermined width that exposes a top surface of a semiconductor body, and forming a spacer adjacent to the vertical sidewall of the first gate structure. The spacer has a first section in the space and a second section. The first section of the spacer is located vertically between the second section of the spacer and the top surface of the semiconductor body. The first section of the spacer extends through the space to the top surface of the semiconductor body, and the first section of the spacer fully fills the space.

In an embodiment of the invention, a structure includes a semiconductor layer having a top surface, a gate structure overlapping with the semiconductor layer, and a first spacer adjacent to a vertical sidewall of the gate structure. The first spacer has a first section and a second section vertically between the first section and the top surface of the semiconductor layer. The first section has a first thickness. The second section has a second thickness that is different from the first thickness.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
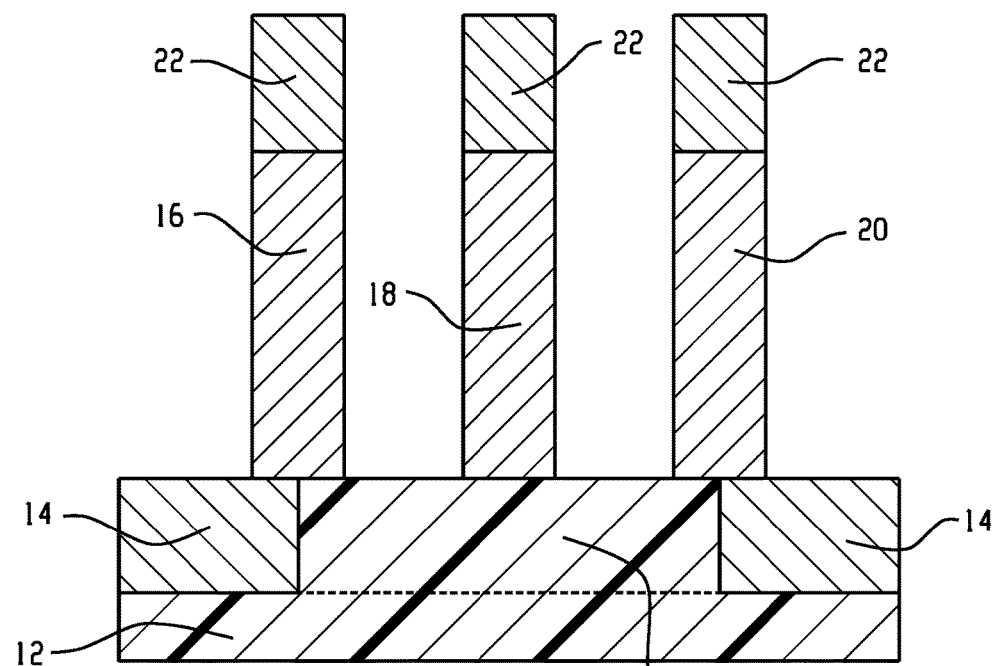
FIGS. 1-8 are cross-sectional views of a portion of a substrate at successive stages of a processing method in accordance with embodiments of the invention.

With reference to FIG. 1 and in accordance with embodiments of the invention, an active device region 10 is surrounded by trench isolation 14 formed in a substrate 12. The active device region 10 defines a semiconductor body for use in front-end-of-line (FEOL) device fabrication. The substrate 12 may be a bulk substrate or a device layer of a semiconductor-on-insulator (SOI) substrate. The trench isolation 14 may be formed by a shallow trench isolation (STI) technique in which trenches are formed in the substrate 12 and then filled with an electrical insulator that is deposited and then planarized with, for example, chemical mechanical polishing (CMP). The trench isolation 14 may be comprised of a dielectric material, such as silicon dioxide ($SiO_2$), deposited by CVD.

Gate structures 16, 18, 20 are formed on the top surface of the active device region 10. The gate structures 16, 18, 20, which may be composed of a semiconductor material such as polysilicon, are covered at their respective top surfaces by a cap 22 composed of one or more dielectric layers, such as a thin layer of silicon nitride ($Si_3N_4$) in combination with a thin layer of silicon dioxide ($SiO_2$). The gate structures 16, 18, 20 and their respective caps 22 may be formed by depositing a layer stack of their constituent materials and etching in the presence of a patterned etch mask (not shown) with the caps 22 operating as a hardmask during etching to form the gate structures 16, 18, 20.

Figure 2:
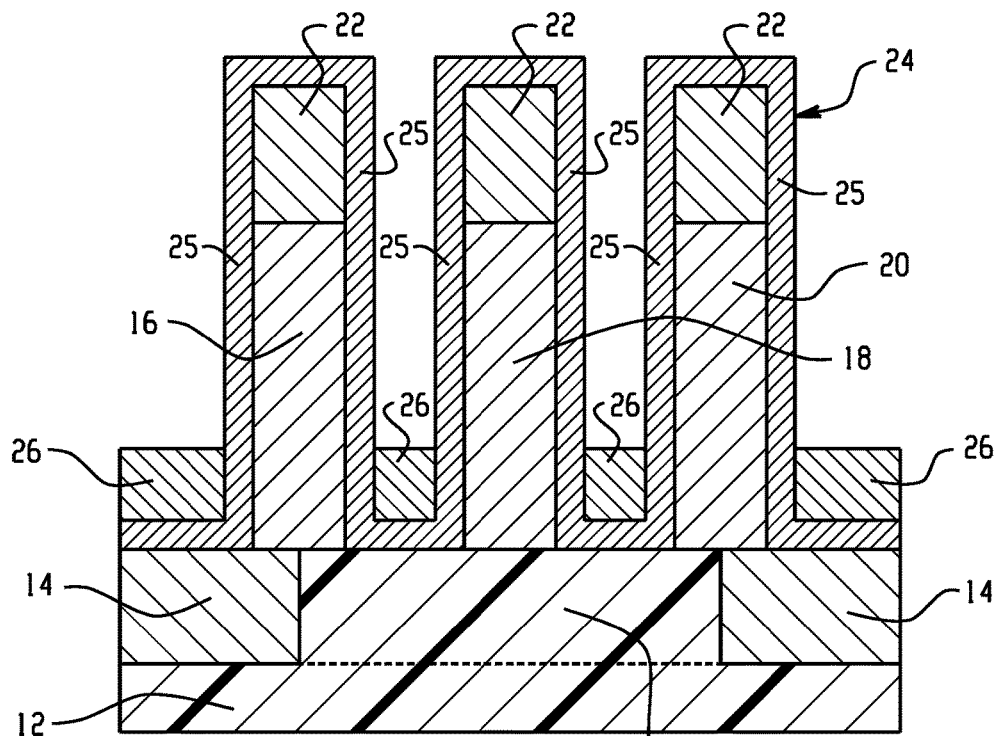

With reference to FIG. 2 in which like reference numerals refer to like features in FIG. 1 and at a subsequent fabrication stage, a conformal layer 24 is deposited that covers the gate structures 16, 18, 20 and the top surface of the active device region 10 in the gaps between adjacent pairs of the gate structures 16, 18, 20. The conformal layer 24, which is sacrificial, includes dummy spacers 25 that are located on the vertical sidewalls of the gate structures 16, 18, 20. The conformal layer 24 may be composed of a material such as silicon-germanium (SiGe) or aluminum oxide ($Al_2O_3$). Because the conformal layer 24 is not etched to remove its material from horizontal surfaces, the thickness of the conformal layer 24 and its dummy spacers 25 does not have to be selected to account for lateral material loss during etching (e.g., reactive ion etching (RIE) and can be made thinner than the conformal layer used to form spacers in a conventional process flow.

A gap-fill layer 26 is formed on the horizontal surfaces of the sections of the conformal layer 24 positioned in the gaps between the dummy spacers 25. The gap-fill layer 26 may be composed of a dielectric material, such as silicon dioxide ($SiO_2$) deposited by CVD. The gap-fill layer 26 may be formed by depositing a layer of its constituent material, planarizing the layer with, for example, chemical mechanical polishing (CMP), and recessing with an etch-back process to provide a desired thickness. The material constituting the gap-fill layer 26 may be chosen to be selectively removed relative to the respective materials constituting the gate structures 16, 18, 20 and the conformal layer 24. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 3:
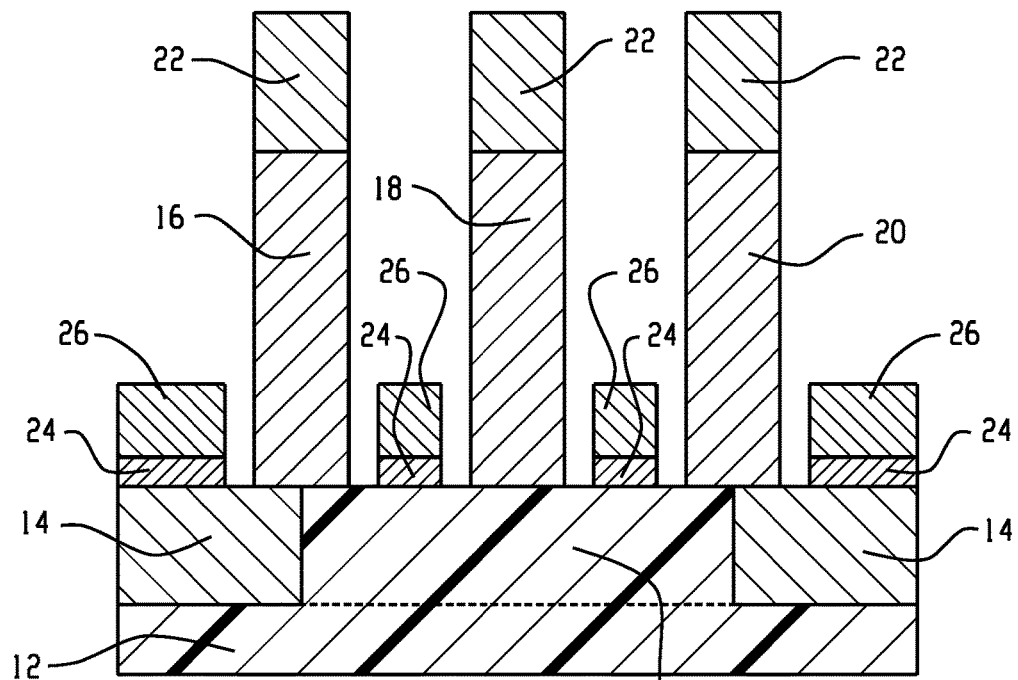

With reference to FIG. 3 in which like reference numerals refer to like features in FIG. 2 and at a subsequent fabrication stage, the dummy spacers 25 are removed by an etching process and an over etch may be used to ensure complete removal. The etching process may involve a combination of an isotropic etch followed by an anisotropic etch that removes the material of the conformal layer 24 selective to the material of the gap-fill layer 26. The gap-fill layer 26 masks portions of the conformal layer 24 located on the top surface of the active device region 10 during the removal of the dummy spacers 25, and spaces are formed adjacent to the vertical sidewalls of the gate structures 16, 18, 20. A patterned mask layer is thereby defined that includes the portion of the gap-fill layer 26 between the gate structure 16 and gate structure 18 and the underlying portion of the conformal layer 24 as a feature, and the portion of the gap-fill layer 26 between the gate structure 18 and gate structure 20 and the underlying portion of the conformal layer 24 as another feature. Additional features of the mask layer are located adjacent to gate structure 16 and adjacent to gate structure 20. The thickness of the features in the mask layer is equal to the sum of the thicknesses of the gap-fill layer 26 and the conformal layer 24. The mask layer includes spaces formed between the features of the mask layer and the gate structures 16, 18, 20, and the spaces have a predetermined width equal to the thickness of the conformal layer 24.

Figure 4:
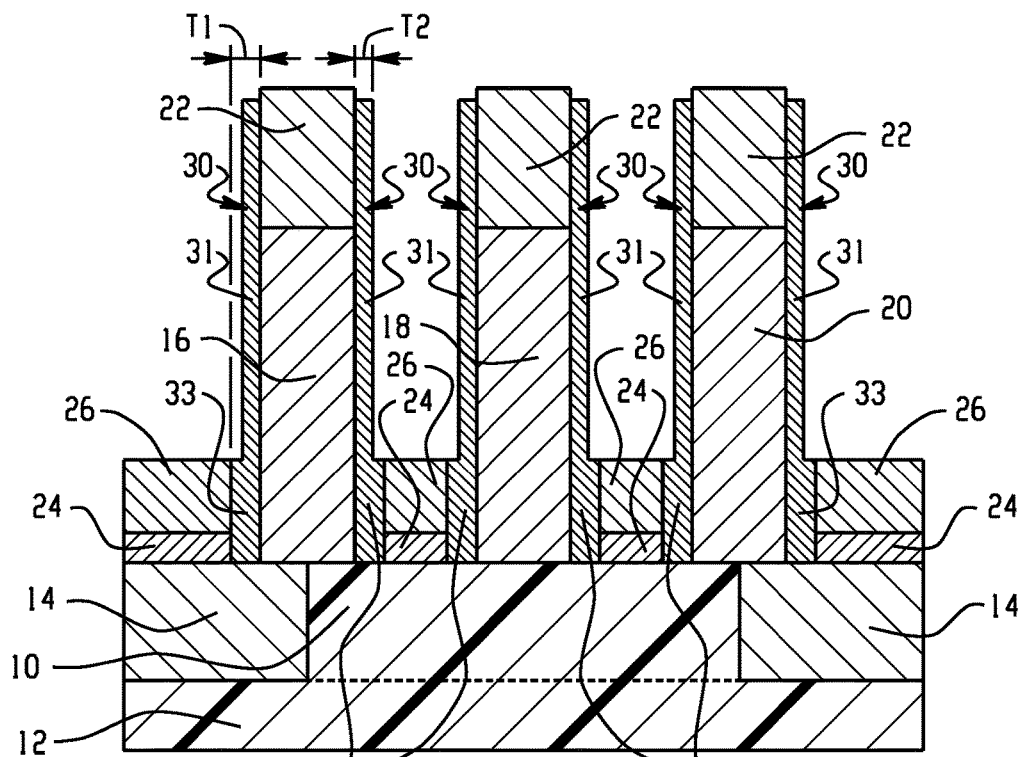

With reference to FIG. 4 in which like reference numerals refer to like features in FIG. 3 and at a subsequent fabrication stage, spacers 30 are formed on the vertical sidewalls of the gate structures 16, 18, 20. The spacers 30 may be formed by depositing a conformal layer comprised of a dielectric material, such as a nitride like SiBCN, SiCN, etc. deposited by CVD, and shaping the conformal layer with an anisotropic etching process, such as reactive ion etching (RIE), that preferentially removes the dielectric material from horizontal surfaces, such as the top conformal layer 26.

The spacers 30 have multiple thicknesses arranged along the height of the gate structures 16, 18, 20. In particular, the spacers 30 may have a section 33 with a thickness T1 at locations horizontally between the features of the mask layer defined by gap-fill layer 26 and the vertical sidewalls of the gate structures 16, 18, 20, and a section 31 with a thickness T2 above the gap-fill layer 26. The thicknesses may be measured relative to the respective vertical sidewalls of the gate structures 16, 18, 20. The thickness of the section 33 of the spacers 30 may be equal to the thickness of the conformal layer 24 and dummy spacers 25 (FIG. 2) removed to expose areas on the top surface of the active device region 10.

Through control over the deposition conditions, the thickness of section 31 of the spacers 30 may be less than the thickness of the conformal layer 24 and dummy spacers 25(FIG. 2) removed to expose selected areas on the top surface of the active device region 10. Because the thickness of the sections 31 and the thickness of the sections 33 may be independently selected, the thickness of the sections 31 is less than the thickness of sections 33. The sections 31 may be thinner the conventional spacers used for the isolating source/drain regions from gate structures such that the space is wider between sections 31 at the top of the gate structures 16, 18, 20 for patterning of layers subsequently deposited in the gaps between the spacer-clad gate structured 16, 18, 20, such as layers deposited for contact formation to the source/drain regions.

The sections 33 may have a contacting relationship with the top surface of the active device region 10 and may fully fill the spaces (i.e., gapes) of predetermined width defined between the features of the mask layer and the gate structures 16, 18, 20. The vertical height of the section 33 of the spacers 30 is given by a sum of the thickness of the gap-fill layer 26 and the thickness of the masked portions of the conformal layer 24 located between the gap-fill layer 26 and the top surface of the active device region 10 in the mask layer.

Figure 5:
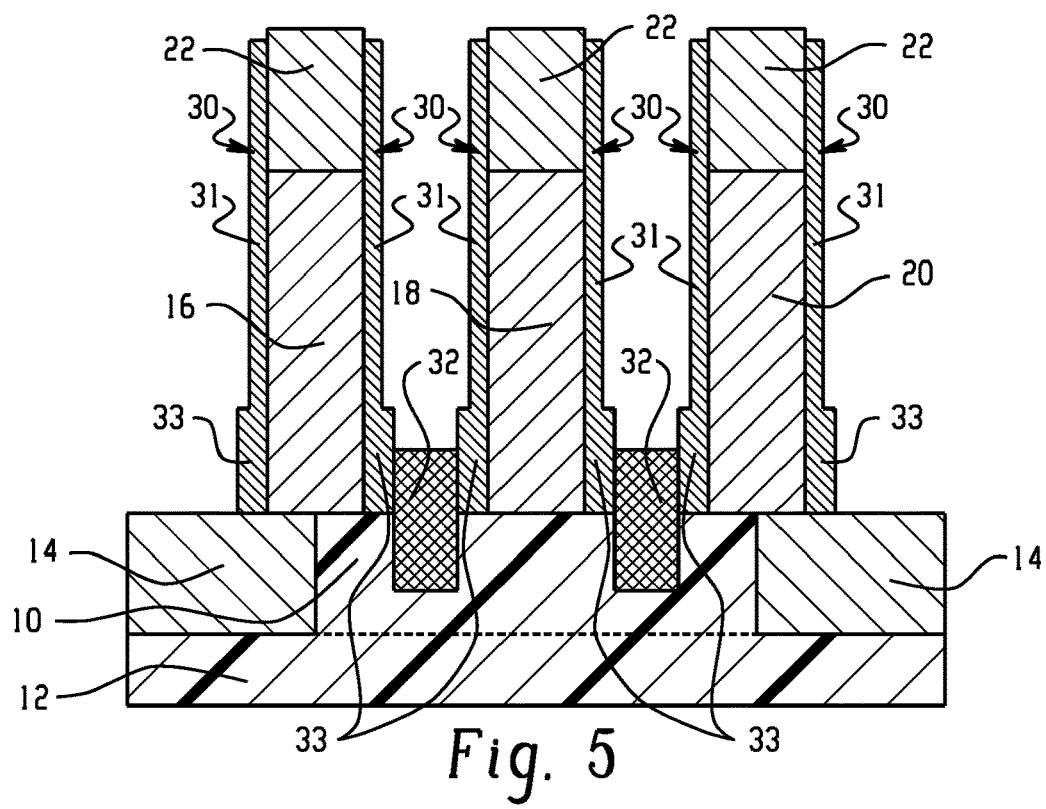

With reference to FIG. 5 in which like reference numerals refer to like features in FIG. 4 and at a subsequent fabrication stage, the gap-fill layer 26 and the underlying conformal layer 24 are removed from the top surface of the active device region 10 in the gaps between the spacer-clad gate structures 16, 18, 20. For example, the gap-fill layer 26 may be removed by a buffered hydrofluoric acid solution if composed of silicon dioxide and the conformal layer 24 may be removed by a different etch chemistry appropriate for its removal. The etching processes remove the constituent materials of the gap-fill layer 26 and conformal layer 24 selective to the materials of the spacers 30 and the active device region 10.

A semiconductor layer 32 is formed by epitaxial growth on the areas on the top surface of active device region 10 exposed in the gaps between the spacer-clad gate structures 16, 18, 20 by the removal of the conformal layer 24 and the gap-fill layer 26 on the conformal layer 24. The semiconductor layer 32 may form raised source/drain regions. The semiconductor layer 32 may be comprised of a semiconductor material, such as silicon germanium (SiGe) or silicon (Si), and may be in situ doped during growth to impart a given conductivity type to the semiconductor material.

Figure 6:
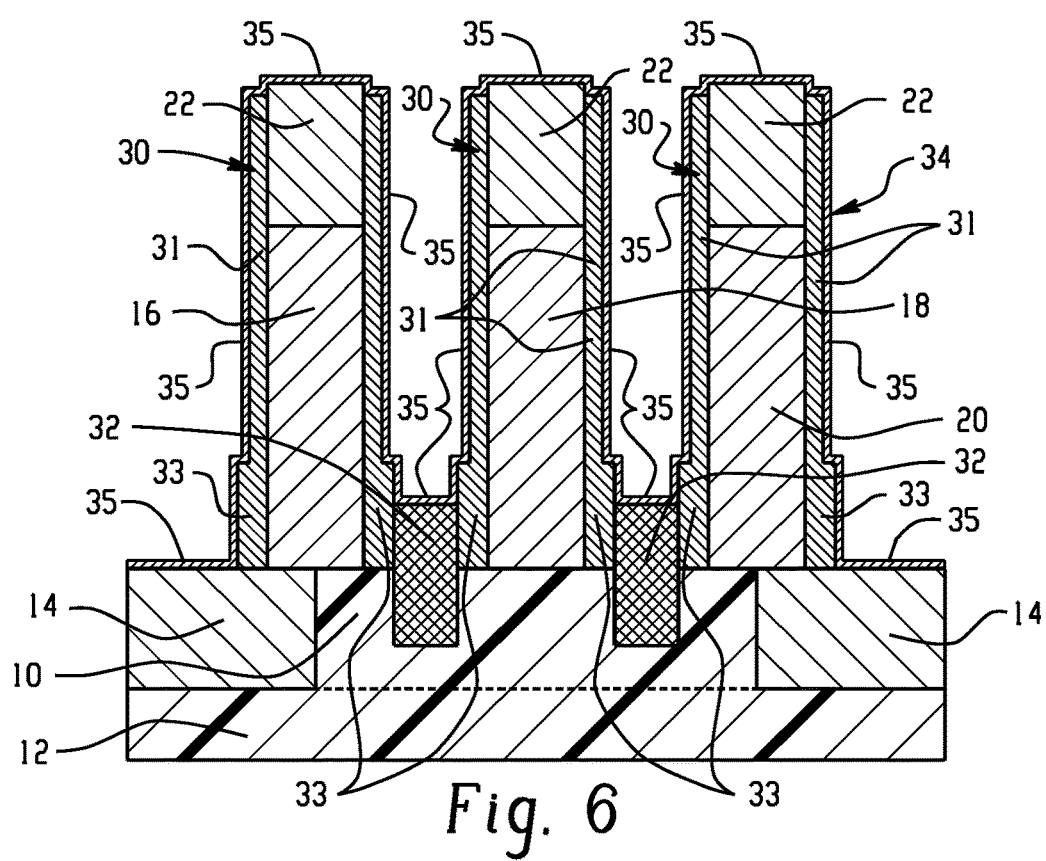

With reference to FIG. 6 in which like reference numerals refer to like features in FIG. 5 and at a subsequent fabrication stage, a conformal layer 34 is deposited as a liner that covers the spacers 30 on the gate structures 16, 18, 20 and the sections of the semiconductor layer 32 formed on the active device region 10 in the gaps between the spacer-clad gate structures 16, 18, 20. The conformal layer 34 forms spacers 35 on the vertical sidewalls of the gate structures 16, 18, 20, and may be composed of a material with a dielectric constant that is less than the dielectric constant of the spacers 30. For example, the conformal layer 34 may be composed of a SiBCN containing a dopant to reduce the value of its dielectric constant relative to the dielectric constant of SiBCN lacking the dopant.

Figure 7:
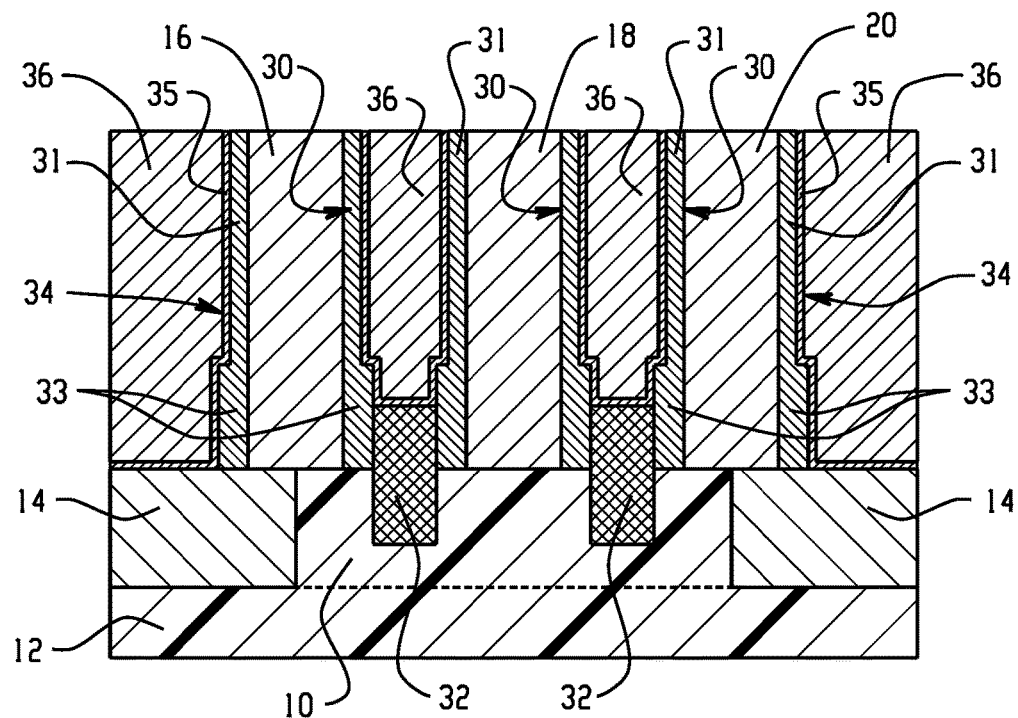

With reference to FIG. 7 in which like reference numerals refer to like features in FIG. 6 and at a subsequent fabrication stage, an interlayer dielectric layer 36 is formed the fills the gaps between the spacers 30 and conformal layer 34 on the vertical sidewalls of the gate structures 16, 18, 20. The interlayer dielectric layer 36 may be composed of a material, such as silicon dioxide ($SiO_2$), deposited by CVD. The interlayer dielectric layer 36 may be formed by depositing a layer of its constituent material and planarizing the layer with, for example, chemical mechanical polishing (CMP) to open the top surface of the caps 22 on the gate structures 16, 18, 20 for subsequent removal of the gate structures 16, 18, 20.

Figure 8:
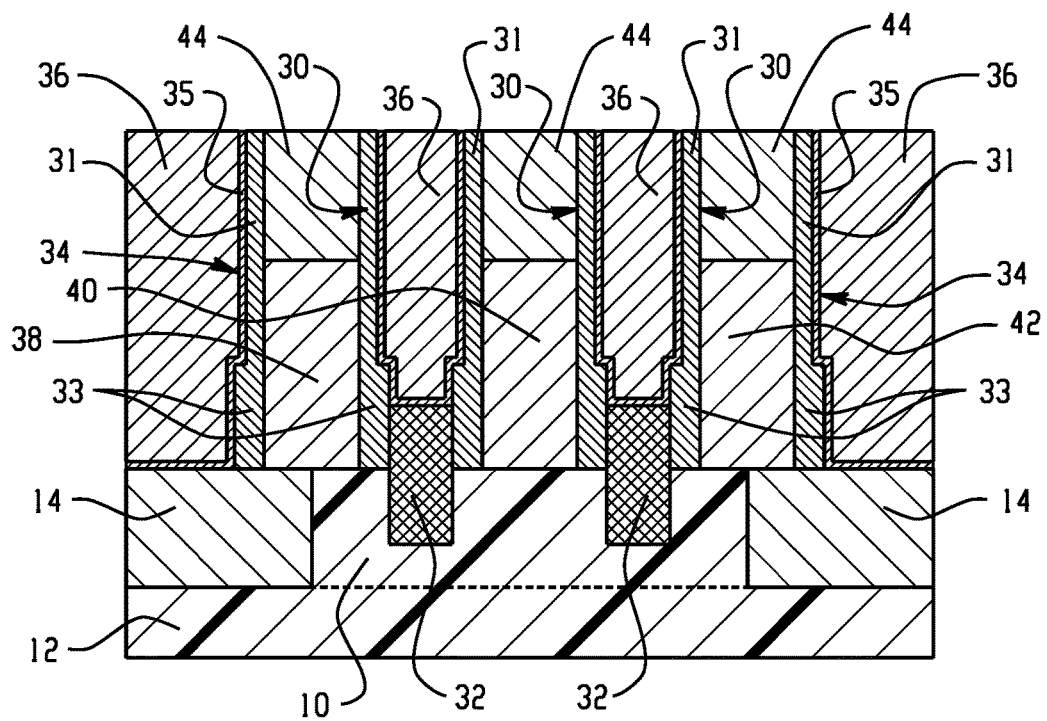
Figure 9:
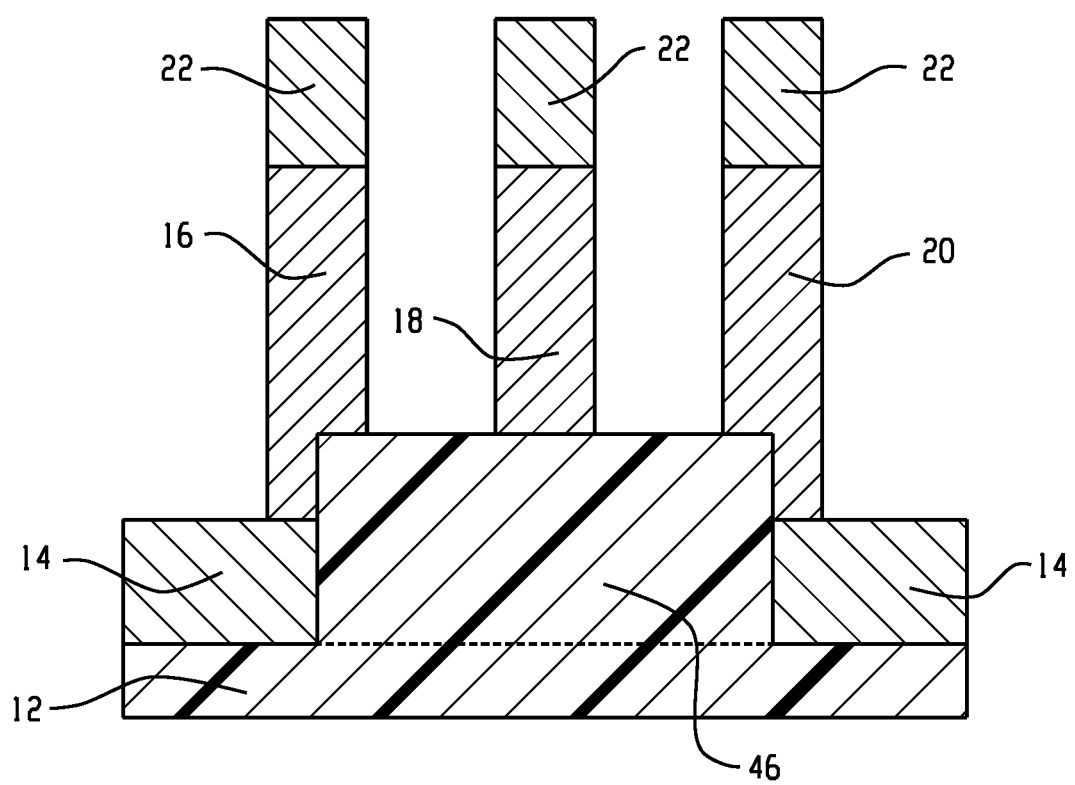
FIG. 9 is a cross-sectional view of a portion of a substrate at an initial stage of a processing method in accordance with embodiments of the invention.

With reference to FIG. 8 in which like reference numerals refer to like features in FIG. 7 and at a subsequent fabrication stage, an etching process is performed to remove the gate structures 16, 18, 20 to thereby define gate cavities in which replacement gate structures will subsequently be formed. The etching process removes the material constituting the gate structures 16, 18, 20 selective to the materials of the active device region 10, spacers 30, spacers 35, and the interlayer dielectric layer 36. A gate dielectric (not shown) composed of a high-k material, such as hafnium oxide, is formed on the top surface of the active device region 10 exposed inside the gate cavities, and replacement gate electrodes 38, 40, 42 are formed in the gate cavities. The gate electrodes 38, 40, 42 may be comprised of a metal, such as aluminum or tungsten, deposited by physical vapor deposition (PVD), CVD, etc., and may also include one or more work function metal layers present to adjust the threshold voltage. Caps 44 composed of a dielectric material, such as SiOCN, are located on the respective top surfaces of the gate electrodes 38, 40, 42.

The spacers 30, 35 are not formed by a conventional deposition and etch process. Instead, the dummy spacers 25 composed of a sacrificial material are formed initially to define a spacer width for the space later filled by spacers 30, 35. The dummy spacers 25 are formed without using a spacer RIE process. This modification to the conventional process eliminates lateral spacer width loss, which is beneficial for tight pitch spacer formation.

The gap-fill layer 26 and the underlying conformal layer 24 between the dummy spacers 25 introduce additional sacrificial material that anchors the spacer width of the sections 33 of the spacers 30. This additional sacrificial material permits the sections 31 of the spacers 30 to be thinner than the sections 33 of the spacers 30, which is beneficial for additional liner material deposition used in complementary metal-oxide-semiconductor patterning. The spacers 30 are formed by deposition and without etching, which eliminates the need to account for erosion of the spacers 30 during etching.

With reference to FIG. 8 in which like reference numerals refer to like features in FIG. 1 and in accordance with embodiments of the invention, the gate structures 16, 18, 20 may be formed on the top surface of a fin 46 and the trench isolation 14 surrounding the fin 46. The fin 46 may be formed during front-end-of-line (FEOL) device fabrication from the semiconductor material of the substrate 12 by photolithography and etching processes, such as a sidewall imaging transfer (SIT) process. The fin 46 provides a semiconductor body that is used in the fabrication of the device structure by the process described in connection with FIGS. 1-8.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:

forming a mask layer having a feature separated from a vertical sidewall of a first gate structure by a space of predetermined width that exposes a top surface of a semiconductor body;

forming a spacer adjacent to the vertical sidewall of the first gate structure, the spacer having a first section in the space and a second section; and after forming the spacer, removing the feature of the mask layer, wherein the mask layer is composed of a dielectric material, the first section of the spacer is located vertically between the second section of the spacer and the top surface of the semiconductor body, the first section of the spacer extends through the space to the top surface of the semiconductor body, and the first section of the spacer fully fills the space.

2. The method of claim 1 wherein the second section of the spacer has a thickness, and the first section of the spacer has a thickness that is greater than the thickness of the second section of the spacer.

3. The method of claim 1 further comprising;

removing the first gate structure; and forming a gate electrode to replace the first gate structure, wherein the spacer is located in the space adjacent to a vertical sidewall of the gate electrode.

4. The method of claim 1 wherein the first section of the spacer is in contact with the top surface of the semiconductor body.

5. The method of claim 1 wherein the second section of the spacer extends over a majority of a height of the first gate structure.

6. The method of claim 1 wherein the semiconductor body is a semiconductor fin.

7. The method of claim 1 wherein the dielectric material is silicon dioxide.

8. A method comprising:
forming a mask layer having a feature separated from a vertical sidewall of a first gate structure by a space of predetermined width that exposes a top surface of a semiconductor body;
forming a spacer adjacent to the vertical sidewall of the first gate structure, the spacer having a first section in the space and a second section;
after forming the spacer, removing the feature of the mask layer; and
after removing the feature of the mask layer, removing the portion of the first conformal layer covered by the feature of the mask layer to expose the top surface of the semiconductor body,
wherein the first section of the spacer is located vertically between the second section of the spacer and the top surface of the semiconductor body, the first section of the spacer extends through the space to the top surface of the semiconductor body, and the first section of the spacer fully fills the space; and
wherein forming the mask layer having the feature separated by the space of the predetermined width that extends to the top surface of the semiconductor body comprises:
depositing a first conformal layer on the vertical sidewall of the first gate structure and on the top surface of the semiconductor body in the space adjacent to the vertical sidewall of the first gate structure;
covering a portion of the first conformal layer located on the top surface of the semiconductor body with the feature of the mask layer; and
removing the first conformal layer from the vertical sidewall of the first gate structure to open the space between the first gate structure and the mask that extends to the top surface of the semiconductor body.

9. The method of claim 8 wherein the first conformal layer has a thickness, the predetermined width is equal to the thickness of the first conformal layer, and the first section of the spacer has a thickness that is equal to the thickness of the first conformal layer.

10. The method of claim 8 further comprising:
growing an epitaxial layer of semiconductor material on the top surface of the semiconductor body,
wherein the first section of the spacer is located between the epitaxial layer of semiconductor material and the vertical sidewall of the first gate structure.

11. The method of claim 8 wherein the portion of the first conformal layer is located between the vertical sidewall of the first gate structure and a vertical sidewall of a second gate structure.

12. The method of claim 11 wherein covering the portion of the first conformal layer located on the top surface of the semiconductor body with the mask comprises:
depositing a gap-fill layer between the first gate structure and the second gate structure to define the mask.

13. The method of claim 12 wherein the first conformal layer has a thickness, the gap-fill layer has a thickness, and the first section of the spacer has a vertical height that is equal to a sum of the thickness of the first conformal layer and the thickness of the gap-fill layer.

14. The method of claim 8 wherein the mask layer is composed of a dielectric material.

15. The method of claim 14 wherein the dielectric material is silicon dioxide.

16. A method comprising:
forming a mask layer having a feature separated from a vertical sidewall of a first gate structure by a space of predetermined width that exposes a top surface of a semiconductor body;
forming a spacer adjacent to the vertical sidewall of the first gate structure, the spacer having a first section in the space and a second section;
after forming the spacer, removing the feature of the mask layer; and
after removing the feature of the mask layer, growing an epitaxial layer of semiconductor material on the top surface of the semiconductor body,
wherein the first section of the spacer is located vertically between the second section of the spacer and the top surface of the semiconductor body, the first section of the spacer extends through the space to the top surface of the semiconductor body, the first section of the spacer fully fills the space, and the first section of the spacer is located between the epitaxial layer of semiconductor material and the vertical sidewall of the first gate structure.

17. The method of claim 16 further comprising:
depositing a second conformal layer that covers the spacer and the epitaxial layer of semiconductor material,
wherein the spacer is arranged between the second conformal layer and the vertical sidewall of the gate structure.

18. The method of claim 17 wherein the spacer is composed of SiBCN, and the second conformal layer is composed of SiBCN with a lower dielectric constant than the SiBCN of the spacer.

19. The method of claim 16 wherein the mask layer is composed of a dielectric material.

20. The method of claim 19 wherein the dielectric material is silicon dioxide.

* * * * *